(12) United States Patent
Flachowsky et al.

(10) Patent No.: US 8,415,221 B2
(45) Date of Patent: Apr. 9, 2013

(54) SEMICONDUCTOR DEVICES HAVING ENCAPSULATED STRESSOR REGIONS AND RELATED FABRICATION METHODS

(75) Inventors: Stefan Flachowsky, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/015,239

(22) Filed: Jan. 27, 2011

(65) Prior Publication Data
US 2012/0193686 A1   Aug. 2, 2012

(51) Int. Cl.
*H01L 21/336* (2006.01)
(52) U.S. Cl. .......... 438/300; 438/478; 257/E21.409
(58) Field of Classification Search .......... 438/300, 438/478
See application file for complete search history.

(56) References Cited

U.S. PATENT DOCUMENTS
2003/0207555 A1* 11/2003 Takayanagi et al. .......... 438/590
2005/0277271 A1    12/2005 Beintner et al.
2008/0185617 A1*  8/2008 Kuan et al. .................. 257/288

OTHER PUBLICATIONS
German Office Action issued Feb. 29, 2012 in Application No. 10 2012 201 207.9.

* cited by examiner

*Primary Examiner* — Alexander Ghyka
(74) *Attorney, Agent, or Firm* — Ingrassia Fisher & Lorenz, P.C.

(57) ABSTRACT

Apparatus and related fabrication methods are provided for semiconductor device structures having silicon-encapsulated stressor regions. One method for fabricating a semiconductor device structure involves the steps of forming a gate structure overlying the semiconductor substrate, forming recesses in the semiconductor substrate about the gate structure, forming a stress-inducing semiconductor material in the recesses, and forming a silicon material in the recesses overlying the stress-inducing semiconductor material. In an exemplary embodiment, the silicon material formed in the recesses is epitaxially-grown on the stress-inducing semiconductor material.

13 Claims, 6 Drawing Sheets

SEMICONDUCTOR DEVICES HAVING ENCAPSULATED STRESSOR REGIONS AND RELATED FABRICATION METHODS

TECHNICAL FIELD

Embodiments of the subject matter generally relate to semiconductor device structures and related fabrication methods, and more particularly, embodiments of the subject matter relate to devices and related fabrication methods for semiconductor devices having encapsulated stressor regions.

BACKGROUND

Transistors, such as metal oxide semiconductor field-effect transistors (MOSFETs), are the core building block of the vast majority of semiconductor devices. Epitaxial stressor regions are frequently used to increase the mobility of carriers in the channels of the MOS transistors, and thereby achieve a corresponding improvement in performance. However, the stressor regions and the substrate material have different chemical properties (e.g., etch rates, oxidation rates, diffusion rates, and the like) that increase the difficulty of integrating epitaxial stressor regions into existing fabrication processes.

BRIEF SUMMARY

A method is provided for fabricating a semiconductor device structure on a semiconductor substrate involving the steps of forming a gate structure overlying the semiconductor substrate, forming recesses in the semiconductor substrate about the gate structure, forming a stress-inducing semiconductor material in the recesses, and forming a silicon material in the recesses overlying the stress-inducing semiconductor material.

In another embodiment, a method of fabricating a semiconductor device structure on a semiconductor substrate involves the steps of forming a gate structure overlying the semiconductor substrate, forming recesses in the semiconductor substrate about the gate structure, forming stressor regions in the recesses, and epitaxially growing a silicon material in the recesses on exposed surfaces of the stressor regions.

In another embodiment, another apparatus for a semiconductor device is provided. The semiconductor device includes a semiconductor substrate, a gate structure overlying the semiconductor substrate, stressor regions formed in the semiconductor substrate proximate the gate structure, and a silicon material overlying and encapsulating the stressor regions.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices that include stressor regions to increase mobility of carriers in the channel region. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of semiconductor devices are well known and so, in the interest of brevity, many conventional steps will only be mentioned briefly herein or will be omitted entirely without providing the well known process details.

Figure 1:
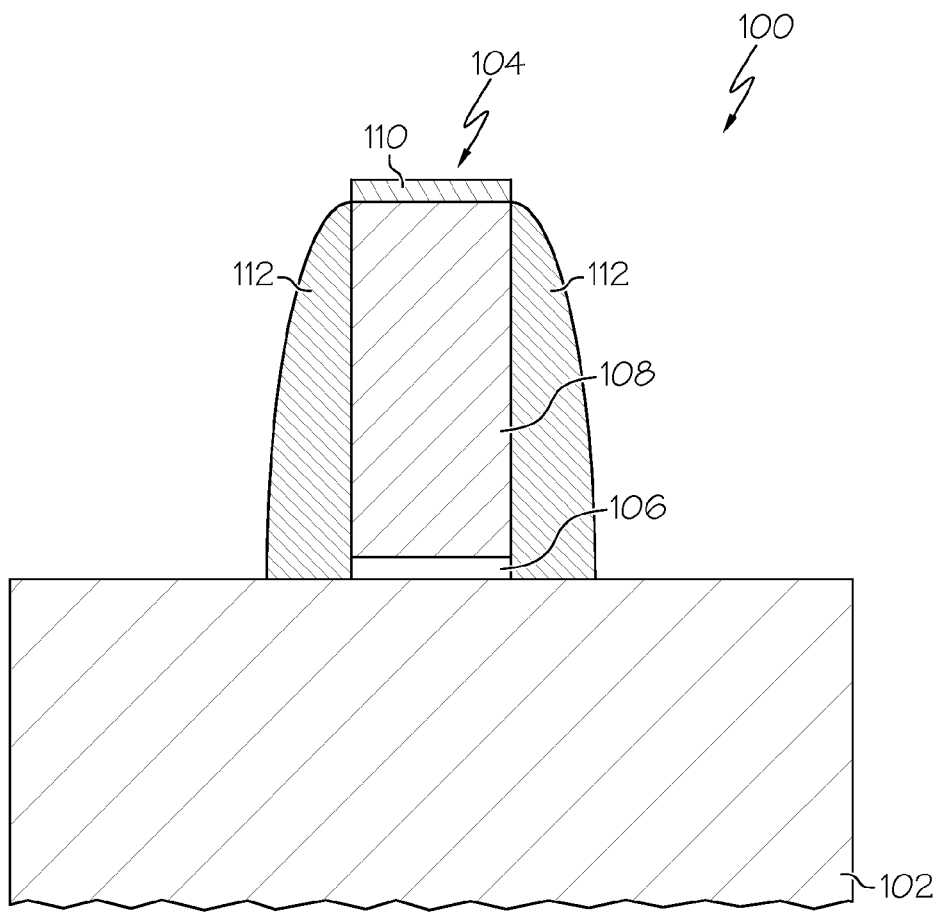
FIGS. 1-6 are cross-sectional views that illustrate a semiconductor device structure and methods for fabricating the semiconductor device structure in exemplary embodiments.

Referring now to FIG. 1, in an exemplary embodiment, the fabrication process begins by forming a gate structure 104 overlying a region of semiconductor material 102 and forming a spacer 112 about sidewalls of the gate structure 104, resulting in the semiconductor device structure 100 of FIG. 1. In an exemplary embodiment, the region of semiconductor material 102 is formed from a substrate (or wafer) of semiconductor material 102 and may be electrically isolated from neighboring regions of the substrate that are used to fabricate other semiconductor devices in a conventional manner (e.g., by performing shallow trench isolation), as will be appreciated in the art. The substrate semiconductor material 102 is preferably realized as a monocrystalline silicon material, and accordingly, for convenience, the semiconductor material 102 is alternatively referred to herein as silicon material. Depending on the embodiment, the substrate of silicon material 102 may be realized as a silicon-on-insulator (SOI) substrate or a bulk silicon substrate. In an exemplary embodiment, the region of silicon material 102 is doped to achieve a desired dopant profile for the channel region of a MOS transistor structure subsequently formed on the region of silicon material 102 prior to forming the gate structure 104. For example, for a PMOS transistor, an N-well may be formed by implanting N-type ions, such as phosphorous ions, into the silicon material 102 prior to forming the gate structure 104.

In the illustrated embodiment, the gate structure 104 functions as a gate electrode for a MOS transistor structure subsequently formed on the region of silicon material 102. The gate structure 104 can be created using a conventional gate stack module or any combination of well-known process steps. As illustrated in FIG. 1, the gate structure 104 preferably includes at least one layer of dielectric material 106, at least one layer of conductive gate electrode material 108, and at least one layer of a dielectric capping material 110. For example, the gate structure 104 may be formed by growing or depositing one or more layers of dielectric material 106, such as an oxide material or a high-k dielectric material, overlying the silicon material 102. After forming the gate dielectric material 106, fabrication of gate structure 104 may continue by depositing one or more layers of conductive gate electrode material 108, such as a metal material or polycrystalline silicon (polysilicon), overlying the layer(s) of dielectric material 106. After forming the gate electrode material 108, fabrication of gate structure 104 may continue by depositing one or more layers of dielectric material 110, such as a nitride material (e.g., silicon nitride, silicon oxynitride, or the like), overlying the conductive material 108. Portions of the dielectric material 106, conductive material 108, and capping material 110 are then selectively removed, preferably using an anisotropic etchant, to define the gate structure 104 with sidewalls substantially perpendicular to (or orthogonal to) the surface of the silicon material 102. The remaining portion of capping material 110 functions as a gate cap that protects the underlying conductive material 108 during subsequent process steps. In this regard, in some embodiments, the conductive material 108 may be doped prior to forming the capping material 110. It should be understood that various numbers, combinations and/or arrangements of materials may be utilized for the gate structure in a practical embodiment, and the subject matter described herein is not limited to any particular number, combination, or arrangement of gate material(s) in the gate structure.

In an exemplary embodiment, after forming the gate structure 104, the spacer 112 is formed about the sidewalls of the gate structure 104 by forming a layer of insulating material overlying the gate structure 104 and selectively removing portions of the insulating material. The insulating material is preferably a nitride material, such as silicon nitride, that is conformably deposited overlying gate structure 104 and the surrounding silicon material 102 in a known manner. The spacer 112 is then formed by anisotropically etching the insulating material using processes well known in the art, for example, by using plasma-based RIE (reactive ion etching) and commonly known etchant chemistries. In accordance with one or more embodiments, the insulating material used for the spacer 112 is deposited to a thickness chosen such that the width of the portions of the spacer 112 in contact with the silicon material 102 is within the range of about 8 nm to about 15 nm after etching the insulating material to form the spacer 112.

Figure 2:
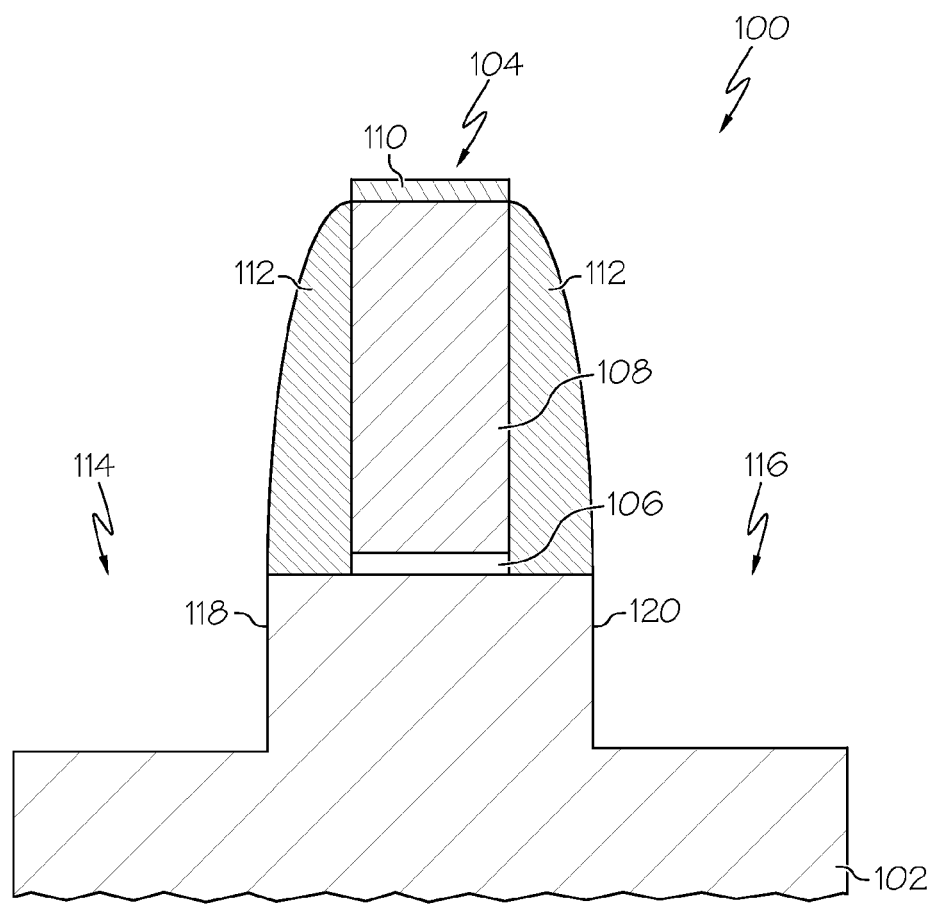

Referring now to FIG. 2, although one or more additional process steps may be performed next (such as source/drain extension formation), in an exemplary embodiment, the fabrication process continues by forming recesses (or cavities) 114, 116 about the gate structure 104 in the exposed portions of the substrate silicon material 102, resulting in the semiconductor device structure 100 of FIG. 2. In this manner, the recesses 114, 116 are vertically aligned with the spacer 112, that is, the interior sidewall surfaces 118, 120 of the recesses 114, 116 are naturally formed such that they are aligned with the outward facing sides of the spacer 112 at the base of the spacer 112. For example, as illustrated in FIG. 2, it appears as though the vertical sidewalls of spacer 112 continue downward to form the corresponding interior sidewall surfaces 118, 120 of the recesses 114, 116 that are proximate the gate structure 104. In this manner, the portions of the substrate silicon material 102 underlying the spacer 112 and gate structure 104 remain intact after the recesses 114, 116 are formed, while the exposed portions of the substrate silicon material 102 are removed by the etchant. The recesses 114, 116 may be formed by anisotropically etching the exposed silicon material 102 using plasma-based RIE (reactive ion etching), using commonly known etchant chemistries which have the advantage of etching silicon with good selectivity to the insulating material (e.g., nitride material) of the spacer 112 and the gate cap 110. In accordance with one or more embodiments, the recesses 114, 116 are etched to a depth relative to the surface of the silicon material 102 within the range of about 40 nm to about 60 nm. However, it will be appreciated that the depth of the recesses 114, 116 relative to the surface of the silicon material 102 will vary depending on the needs of a particular embodiment, and the subject matter described herein is not intended to be limited to any particular depth for the recesses 114, 116.

Figure 3:
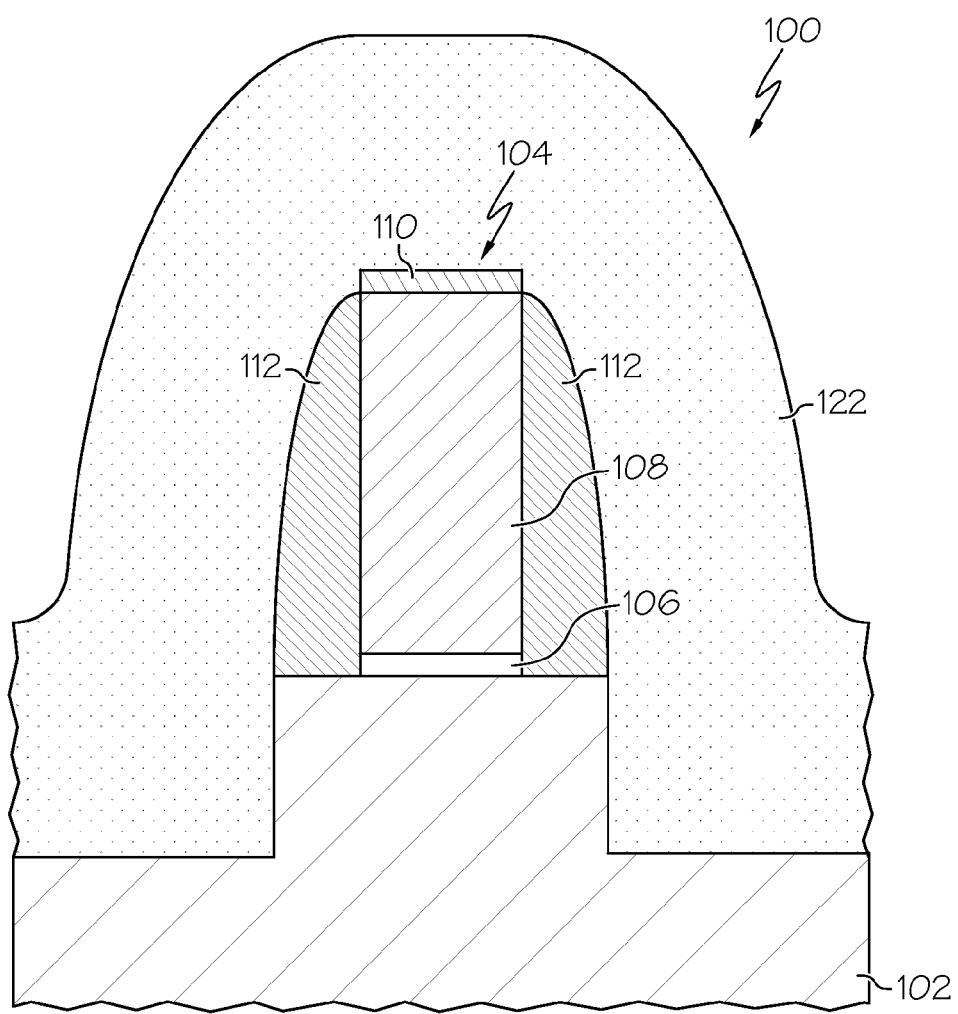

Referring now to FIG. 3, in an exemplary embodiment, after forming recesses 114, 116, the fabrication process continues by forming a layer of a stress-inducing semiconductor material 122 overlying the semiconductor device structure of FIG. 2, resulting in the semiconductor device structure 100 of FIG. 3. In an exemplary embodiment, the layer of stress-inducing semiconductor material 122 is formed by conformably depositing a stress-inducing semiconductor material 122 having a different lattice constant than the substrate silicon material 102 overlying the gate structure 104 and the silicon material 102 in the recesses 114, 116 to apply stress to the channel region of silicon material 102 underlying the gate structure 104. The layer of the stress-inducing semiconductor material 122 is preferably deposited to a thickness greater than or equal to the depth of the recesses 114, 116.

For example, for a PMOS transistor structure, the stress-inducing semiconductor material 122 may be realized as a silicon germanium material or another material having a larger lattice constant than the substrate silicon material 102 to apply a compressive longitudinal stress to the channel region and increase the mobility of holes in the channel region, as will be appreciated in the art. In this regard, in accordance with one embodiment, a layer of silicon germanium is conformably deposited overlying the gate structure 104 and the substrate silicon material 102 in the recesses 114, 116 by chemical vapor deposition (CVD) using dichlorosilane ($SiH_2Cl$) and germane ($GeH_4$) as reactants at a temperature of about 700° C. In integrated complementary MOS (or CMOS) fabrication processes, any surrounding regions of the substrate silicon material 102 that are used for fabricating NMOS transistor structures are masked prior to forming the layer of silicon germanium. In an exemplary embodiment, the germanium concentration is substantially uniform throughout the layer of silicon germanium.

Alternatively, for an NMOS transistor structure, the stress-inducing semiconductor material 122 may be realized as a silicon carbon material or another material having a smaller lattice constant than the substrate silicon material 102 to apply a tensile longitudinal stress to the channel region and thereby increase the mobility of electrons in the channel region. For an NMOS transistor structure, a layer of silicon carbon is conformably deposited overlying the gate structure 104 and the substrate silicon material 102 in the recesses 114, 116 by CVD using trisilane ($Si_3H_8$) and methylsilane ($CH_3SiH_3$) as reactants at a temperature of about 550° C., and in integrated CMOS fabrication processes, any surrounding regions of the substrate silicon material 102 that are used for fabricating PMOS transistor structures are masked prior to forming the layer of silicon carbon.

Figure 4:
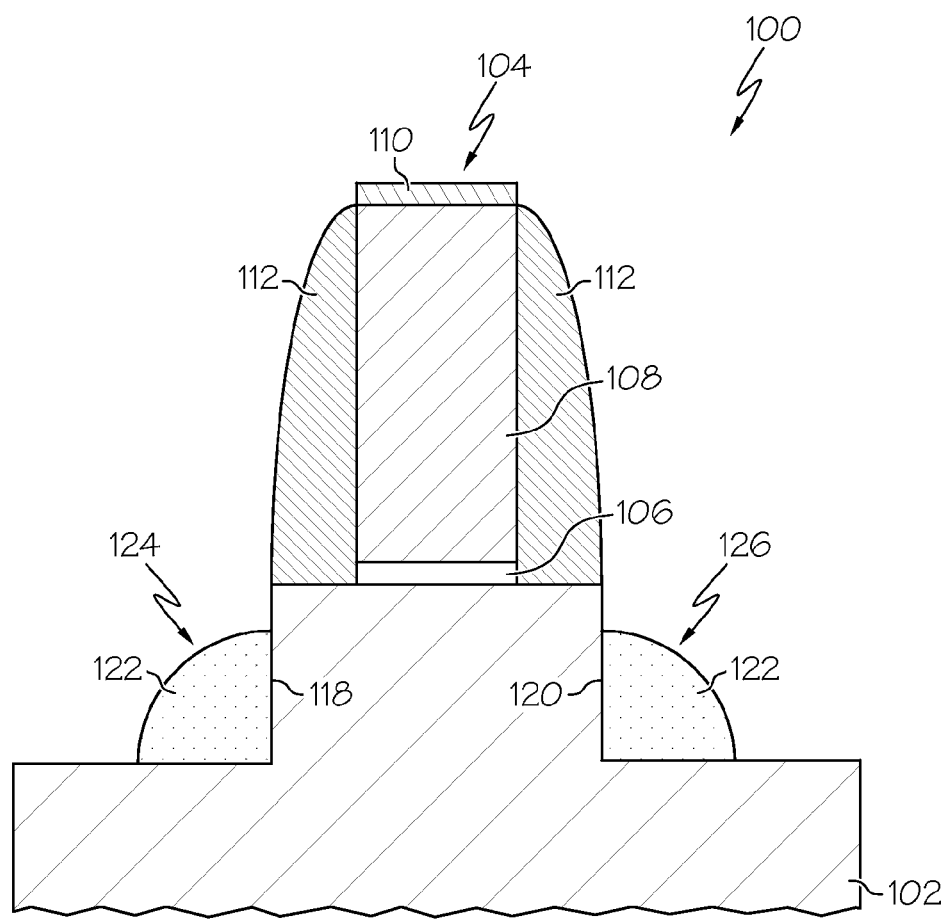

Referring now to FIG. 4, in an exemplary embodiment, the fabrication process continues by removing portions of the stress-inducing semiconductor material 122 to form stressor regions 124, 126 in the recesses 114, 116, resulting in the semiconductor device structure 100 of FIG. 4. In an exemplary embodiment, portions of the stress-inducing semiconductor material 122 are removed by anisotropically etching the stress-inducing semiconductor material 122 using an anisotropic etchant until the stress-inducing semiconductor material 122 is completely removed from the surface of the gate structure 104 and/or gate cap 110 to expose the gate structure 104 and/or gate cap 110. In this manner, the stress-inducing semiconductor material 122 is uniformly removed from the surface of the semiconductor device structure of FIG. 3 to obtain the semiconductor device structure 100 of FIG. 4. In this regard, by virtue of the conformal deposition, the layer of stress-inducing semiconductor material 122 is thickest adjacent to the sidewall spacer 112 and/or sidewall surfaces 118, 120 as illustrated in FIG. 3. Thus, portions of the stress-inducing semiconductor material 122 adjacent to the sidewall surfaces 118, 120 of the recesses 114, 116 remain intact after anisotropically etching the stress-inducing semiconductor material 122 from the gate structure 104 and/or gate cap 110 to provide stressor regions 124, 126 positioned adjacent to the sidewalls 118, 120 of the recesses 114, 116 and proximate the channel region underlying the gate structure 104.

Figure 5:
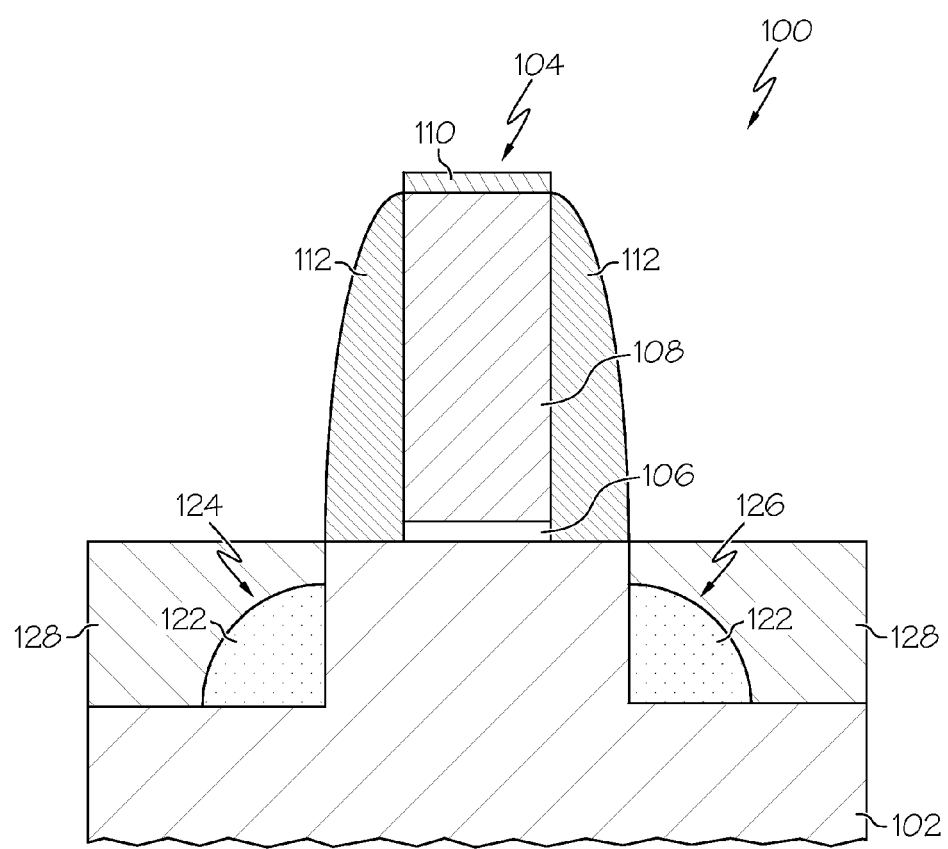

Referring now to FIG. 5, in an exemplary embodiment, after forming the stressor regions 124, 126, the fabrication process continues by forming a silicon material 128 in the recesses 114, 116. In an exemplary embodiment, a monocrystalline silicon material 128 is selectively epitaxially grown on exposed surfaces of the silicon material 102 and stress-inducing semiconductor material 122 by the reduction of dichlorosilane ($SiH_2Cl_2$) or another suitable silicon-comprising material at a temperature of about 720° C. The epitaxial growth of the silicon material 128 is selective, and therefore, the silicon material 128 grows only on the exposed surfaces of the stress-inducing semiconductor material 122 and substrate silicon material 102 without growing on the exposed surfaces of the insulating material (e.g., nitride material) of the sidewall spacer 112 and gate cap 110. In an exemplary embodiment, the silicon material 128 is grown to a thickness that is greater than or equal to the depth of the recesses 114, 116 (e.g., a "flush" fill or slight overfill) to ensure that the recesses 114, 116 are filled to a minimum height that meets or exceeds the surface of the substrate silicon material 102 underlying the gate structure 104. In some embodiments, after growing the silicon material 128, the fabrication process may continue by removing (or etching back) the silicon material 128 using an anisotropic etchant that etches the silicon material 128 with good selectivity to the insulating material of the spacer 112 and gate cap 110 until the upper surface of the silicon material 128 is substantially aligned with the silicon material 102 underlying the gate structure 104. In an exemplary embodiment, the epitaxially-grown silicon material 128 and the substrate silicon material 102 are the same type of material, such that they exhibit the same chemical properties (e.g., etch rates, oxidation rates, and the like). As illustrated in FIG. 5, the stressor regions 124, 126 are encapsulated or otherwise covered by the epitaxially-grown silicon material 128, such that the surfaces of the stressor regions 124, 126 are not exposed. Accordingly, subsequent process steps configured for use with silicon material 102 do not need to be modified to account for the presence of the stressor regions 124, 126 because the stressor regions 124, 126 are not exposed.

After forming the silicon-encapsulated stressor regions 124, 126, any number of known process steps, modules, and techniques can be performed to complete the fabrication of a MOS transistor device structure on the silicon material 102. For example, referring to FIG. 6, in an exemplary embodiment, the fabrication process continues by forming spaced-apart source and drain regions 132, 134 about the gate structure 104, resulting in the semiconductor device structure 100 of FIG. 6. In this regard, the semiconductor device structure 100 of FIG. 6 includes a MOS transistor structure comprised of gate structure 104 and spaced-apart source/drain regions 132, 134, wherein the substrate silicon material 102 disposed beneath the gate structure 104 and between the source/drain regions 132, 134 provides the channel region of the MOS transistor structure.

Figure 6:
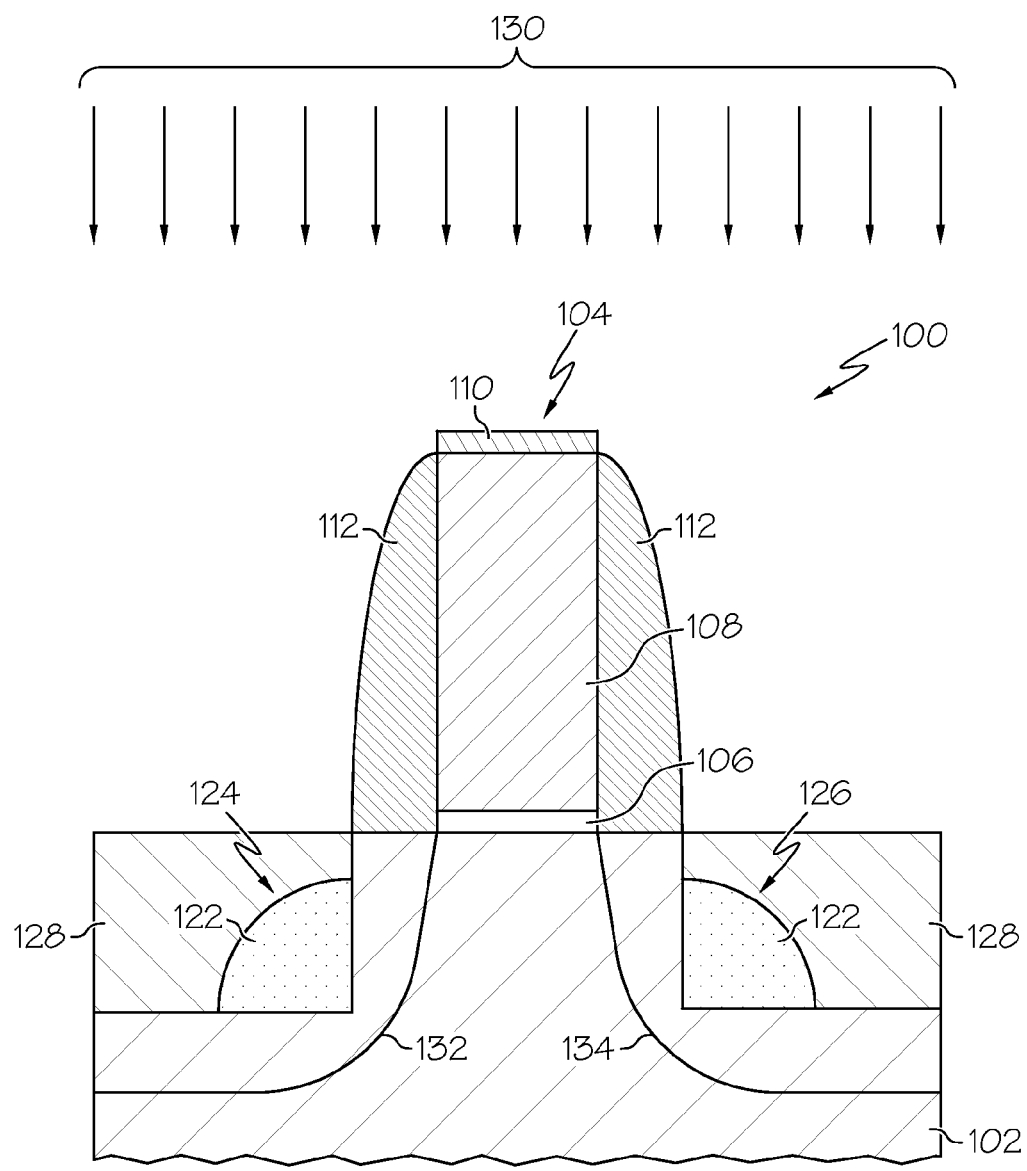

In the illustrated embodiment, the source/drain regions 132, 134 may be formed by implanting dopant ions (illustrated by arrows 130) of a conductivity-determining impurity type into the silicon material 128 to a desired depth and/or sheet resistivity using the gate structure 104 and sidewall spacer 112 as an implantation mask and subsequent thermal annealing. As illustrated in FIG. 6, in accordance with one or more embodiments, the stressor regions 124, 126 are doped when forming the source/drain regions 132, 134, such that a respective stressor region 124, 126 is disposed within a respective source/drain region 132, 134. In other words, the depth of the source/drain regions 132, 134 relative to the surface of the silicon material 128 and/or silicon material 102 is greater than the depth of the recesses 114, 116 relative to the surface of the silicon material 102, that is, the ions 130 are implanted to a depth greater than the depth of the recesses 114, 116 to ensure the stressor regions 124, 126 are disposed within the source/drain regions 132, 134. The conductivity-determining impurity type of the implanted ions 130 is of a conductivity type that is different from the conductivity type of the substrate semiconductor material 102. For example, when the semiconductor material 102 is doped with N-type ions to provide an N-well region, the source/drain regions 132, 134 are formed by implanting P-type ions, such as boron ions, into the epitaxially-grown silicon material 128 and the silicon germanium stressor regions 124, 126 to form a PMOS transistor structure. Alternatively, when the semiconductor material 102 is doped with P-type ions to provide a P-well region, the source/drain regions 132, 134 are formed by implanting N-type ions, such as arsenic ions or phosphorous ions, into the epitaxially-grown silicon material 128 and the silicon carbon stressor regions 124, 126 to form an NMOS transistor structure.

It should be noted that depending on the embodiment, before performing the ion implantation step, the sidewall spacer 112 may be removed or additional sidewall spacers (e.g., offset spacers) may be formed to define the boundaries of the subsequently formed source and drain regions. Thus, it will be appreciated that although FIG. 6 depicts the sidewall spacer 112 as being retained about the sidewalls of the gate structure 104, various alternative implementations exist for defining the boundaries of the source/drain regions 132, 134 and the subject matter is not intended to be limited to a particular manner for defining the boundaries of the source/drain regions 132, 134.

After forming the source/drain regions 132, 134, fabrication of the semiconductor device overlying the silicon material 102 may be completed using well known final process steps, such as deep ion implantation, thermal annealing, formation of conductive contacts overlying the source/drain regions and/or gate structure, and/or other back end process steps, which will not be described in detail herein. By virtue of the epitaxially-grown silicon material 128 encapsulating the stressor regions 124, 126 and exhibiting the same chemical properties as the substrate silicon material 102, these subsequent process steps previously configured for use with silicon material 102 do not need to be modified to account for stressor regions 124, 126 because the stressor regions 124, 126 are not exposed, and therefore, the final process steps may be performed and the fabrication of the MOS transistor device completed in a conventional manner.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device structure on a semiconductor substrate comprising a silicon material, the method comprising:
   forming a gate structure overlying the semiconductor substrate;
   forming recesses in the semiconductor substrate about the gate structure;
   forming a stress-inducing semiconductor material in the recesses; and
   forming a layer of the silicon material in the recesses overlying the stress-inducing semiconductor material,
   wherein forming the stress-inducing semiconductor material in the recesses comprises:
      depositing a layer of the stress-inducing semiconductor material overlying the gate structure and the recesses; and
      removing the stress-inducing semiconductor material overlying the gate structure and from a portion of the recesses,
   wherein depositing the layer of the stress-inducing semiconductor material comprises depositing the layer of the stress-inducing semiconductor material to a first thickness greater than or equal to a depth of the recesses, and wherein removing the stress-inducing semiconductor material comprises anisotropically etching the layer of the stress-inducing semiconductor material to expose the gate structure; and anisotropically etching the layer of the stress-inducing semiconductor material results in stressor regions comprised of the stress-inducing semiconductor material adjacent to sidewalls of the recess proximate the gate structure.

2. The method of claim 1, wherein forming the silicon material in the recesses comprises epitaxially growing the silicon material on exposed surfaces of the stressor regions and on exposed surfaces of the semiconductor substrate in the recesses.

3. The method of claim 2, wherein epitaxially growing the silicon material comprises epitaxially growing the silicon material to a second thickness greater than or equal to the depth of the recesses.

4. The method of claim 2, further comprising forming spaced-apart source and drain regions about the gate structure after epitaxially growing the silicon material in the recesses, wherein the stressor regions are disposed within the source and drain regions.

5. The method of claim 4, wherein forming spaced-apart source and drain regions comprises implanting ions into the silicon material to a depth greater than or equal to the depth of the recesses.

6. The method of claim 1, wherein forming the silicon material in the recesses comprises epitaxially growing the silicon material on exposed surfaces of the stress-inducing semiconductor material and on exposed surfaces of the semiconductor substrate in the recesses.

7. The method of claim 1, further comprising forming spaced-apart source and drain regions about the gate structure after forming the silicon material in the recesses, wherein the stress-inducing semiconductor material in the recesses is disposed within the source and drain regions.

8. The method of claim 7, wherein forming spaced-apart source and drain regions comprises implanting ions of a conductivity-determining impurity type into the silicon material using the gate structure as an implantation mask, wherein the ions diffuse to a depth greater than a depth of the recesses relative to a surface of the semiconductor substrate.

9. A method of fabricating a semiconductor device structure on a semiconductor substrate, the method comprising:
   forming a gate structure overlying the semiconductor substrate;
   forming recesses in the semiconductor substrate about the gate structure;
   forming stressor regions in the recesses; and
   epitaxially growing a silicon material in the recesses on exposed surfaces of the stressor regions,
   wherein the recesses have sidewalls aligned with the sidewall spacer, and wherein:
      forming stressor regions comprises:
         conformally depositing a layer of stress-inducing semiconductor material overlying the gate structure, the sidewall spacer, and the semiconductor substrate; and
         anisotropically etching the layer of stress-inducing semiconductor material from the gate structure to expose the gate structure while leaving intact portions of the layer of stress-inducing semiconductor material in the recesses adjacent to the sidewalls aligned with the sidewall spacer.

10. The method of claim 9, wherein conformably depositing the layer of stress-inducing semiconductor material comprises conformably depositing the layer of stress-inducing semiconductor material to a first thickness greater than or equal to a depth of the recesses.

11. The method of claim 10, wherein epitaxially growing the silicon material comprises epitaxially growing the silicon material to a second thickness greater than or equal to the depth of the recesses.

12. The method of claim 9, further comprising forming a sidewall spacer about the gate structure, wherein forming recesses in the semiconductor substrate comprises anisotropically etching the semiconductor substrate using the gate structure and the sidewall spacer as an etch mask.

13. A method of fabricating a semiconductor device structure on a semiconductor substrate comprising a silicon material, the method comprising:
   forming a gate structure overlying the semiconductor substrate;
   forming recesses in the semiconductor substrate about the gate structure;
   forming a stress-inducing semiconductor material in the recesses; and
   forming a layer of the silicon material in the recesses overlying the stress-inducing semiconductor material,
   wherein forming the stress-inducing semiconductor material in the recesses comprises:
      depositing a layer of the stress-inducing semiconductor material overlying the gate structure and the recesses; and
      removing the stress-inducing semiconductor material overlying the gate structure and from a portion of the recesses, and wherein removing the stress-inducing semiconductor material overlying the gate structure comprises anisotropically etching the layer of the stress-inducing semiconductor material.

* * * * *